United States Patent
Huo et al.

(10) Patent No.: US 11,764,195 B2
(45) Date of Patent: Sep. 19, 2023

(54) DISPLAY PANEL HAVING A PLURALITY OF DISPLAY REGIONS OVERLAP

(71) Applicant: Shanghai Tianma Microelectronics Co., Ltd., Shanghai (CN)

(72) Inventors: Sitao Huo, Shanghai (CN); Shuang Yang, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 0 days.

(21) Appl. No.: 17/652,692

(22) Filed: Feb. 27, 2022

(65) Prior Publication Data
US 2022/0189937 A1    Jun. 16, 2022

(30) Foreign Application Priority Data

Sep. 30, 2021 (CN) .......................... 202111165713.X

(51) Int. Cl.
*H01L 25/16* (2023.01)
*G09G 3/3225* (2016.01)
*G11C 19/28* (2006.01)

(52) U.S. Cl.
CPC ......... *H01L 25/162* (2013.01); *G09G 3/3225* (2013.01); *G11C 19/287* (2013.01); *H01L 25/167* (2013.01); *G09G 2300/0452* (2013.01); *G09G 2310/0286* (2013.01); *G09G 2310/0291* (2013.01)

(58) Field of Classification Search
CPC ...................................................... H01L 25/162

USPC ......................................................... 345/690
See application file for complete search history.

(56) References Cited

U.S. PATENT DOCUMENTS

| | | | |
|---|---|---|---|
| 2017/0154947 A1* | 6/2017 | Nakamura | H01L 51/5284 |
| 2018/0039471 A1* | 2/2018 | Yanagisawa | G06F 3/1446 |
| 2020/0194532 A1* | 6/2020 | Lee | G09G 3/3266 |
| 2021/0303121 A1* | 9/2021 | Ku | H10K 59/40 |

FOREIGN PATENT DOCUMENTS

| | | |
|---|---|---|
| CN | 110491909 A | 11/2019 |
| CN | 111653207 A | 9/2020 |
| CN | 112767849 A | 5/2021 |

* cited by examiner

*Primary Examiner* — Long D Pham
(74) *Attorney, Agent, or Firm* — KILPATRICK TOWNSEND & STOCKTON, LLP

(57) ABSTRACT

Provided are a display panel and a display device. The display panel includes a first display region, a second display region and a non-display region between the first display region and the second display region. The display panel further includes a third display region. The third display region and the non-display region at least partially overlap in the light emission direction of the display panel. In the preceding solution, the third display region is added in the display panel, and the third display region and the non-display region between the first display region and the second display region at least partially overlap in the light emission direction of the display panel, that is, the third display region covers at least part of the joint between the first display region and the second display region.

17 Claims, 9 Drawing Sheets

DISPLAY PANEL HAVING A PLURALITY OF DISPLAY REGIONS OVERLAP

CROSS-REFERENCE TO RELATED APPLICATION(S)

This application claims priority to Chinese patent application No. 202111165713.X filed Sep. 30, 2021, the disclosure of which is incorporated herein by reference in its entirety.

FIELD

Embodiments of the present disclosure relate to the field of display technology and, in particular, to a display panel and a display device.

BACKGROUND

With the development of flat-panel display technology, major manufacturers have launched larger display panels. Due to the limitation of the manufacturing technique, when the size of a display panel cannot be larger, a tiled display device emerges as the times require. The tiled display device has the display effect of a large scene and can bring immersive visual experience to users. Therefore, the tiled display device is widely used in advertising display, publicity, exhibition and other occasions.

However, with the problem that a joint is visible in the tiled display device, the display effect of the tiled display device is affected.

SUMMARY

Embodiments of the present disclosure provide a display panel and a display device to eliminate the problem that the joint is visible in the tiled display device.

In one embodiment of the present disclosure provides a display panel. The display panel includes a first display region, a second display region and a non-display region between the first display region and the second display region.

The display panel further includes a third display region. The third display region and the non-display region at least partially overlap in the light emission direction of the display panel.

In another embodiment of the present disclosure provides a display device. The device includes the display panel provided in the other embodiments.

DETAILED DESCRIPTION

Figure 1:
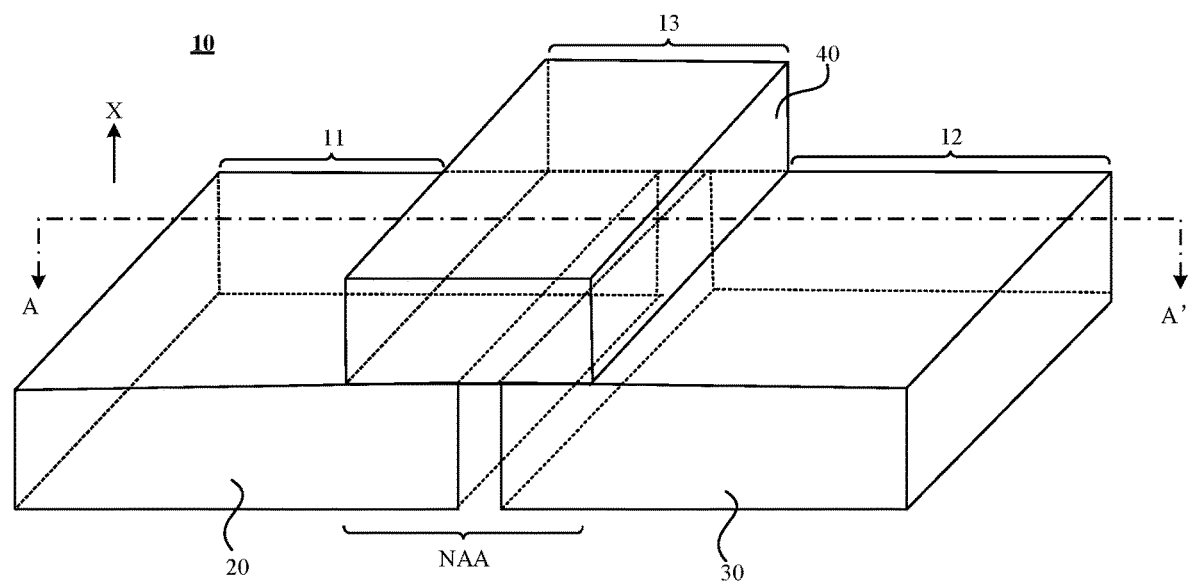
FIG. 1 is a view illustrating the structure of a display panel according to an embodiment of the present disclosure.

The present disclosure is further described hereinafter in detail in conjunction with drawings and embodiments. It is to be understood that the embodiments described herein are merely intended to explain the present disclosure and not to limit the present disclosure. Additionally, it is to be noted that for ease of description, only a part, not all, of the structures related to the present disclosure are illustrated in the drawings. In one embodiment, the shape and size of each element in the drawings do not reflect the actual scale, and the purpose is merely to schematically illustrate the content of the present disclosure.

FIG. 1 is a view illustrating the structure of a display panel according to an embodiment of the present disclosure. As shown in FIG. 1, the display panel 10 includes a first display region 11, a second display region 12 and a non-display region NAA between the first display region 11 and the second display region 12. The display panel 10 further includes a third display region 13. The third display region 13 and the non-display region NAA at least partially overlap in the light emission direction (the X-direction as shown in the figure) of the display panel 10.

In an embodiment, as shown in FIG. 1, the display panel 10 includes a first display region 11, a second display region 12 and a non-display region NAA between the first display region 11 and the second display region 12. The non-display region NAA may be a joint region between the first display region 11 and the second display region 12. The joint region may be a gap formed by the presence of air between the first display region 11 and the second display region 12. Since the joint region cannot be displayed normally, the joint is visible. As a result, the display effect of the display panel is affected. This embodiment of the present disclosure creatively adds the third display region 13 in the display panel 10. The third display region 13 and the non-display region NAA are configured to at least partially overlap in the light emission direction (the X-direction as shown in the figure) of the display panel 10, that is, the third display region is configured to cover at least part of the non-display region NAA. In this manner, the problem that the joint is visible can be alleviated or eliminated. Therefore, the display effect of the display panel 10 can be improved. In one embodiment, with the configuration in which the third display region 13 and the non-display region NAA at least partially overlap, the display area of the display panel can further be improved, and the display effect can further be improved. As a result, the tiled display panel with good display effect can be ensured.

Further, the third display region 13 may be configured to completely cover at least part of the non-display region NAA in the light emission direction (the X-direction as shown in the figure) of the display panel 10, that is, the third display region 13 completely covers the joint between the first display region 11 and the second display region 12. In this manner, the problem that the joint is visible can be eliminated completely. In one embodiment, the display area of the display panel 10 can be maximized, and the display effect of the tiled display panel can further be improved.

Further, the display panel according to this embodiment of the present disclosure may be a flexible display panel or a rigid display panel. This is not limited in this embodiment of the present disclosure.

In summary, in the display panel according to this embodiment of the present disclosure, the third display region is added in the display panel, and the third display region and the non-display region between the first display region and the second display region at least partially overlap in the light emission direction of the display panel. The third display region covers the joint between the first display region and the second display region. In this manner, the problem of the visible joint between the first display region and the second display region can be alleviated, and the display effect of the display panel can be improved. In one embodiment, with the configuration in which the third display region and the non-display region at least partially overlap, the display area of the display panel can further be improved, and the display effect can further be improved.

Figure 2:
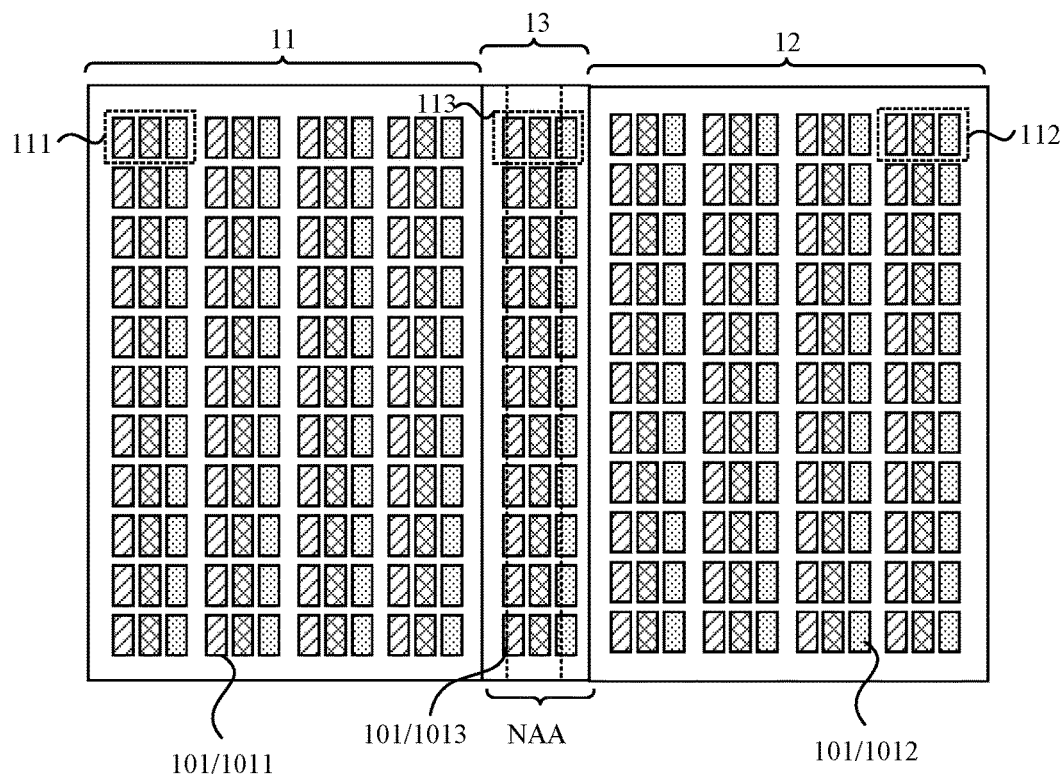
FIG. 2 is a top view illustrating the structure of a display panel according to an embodiment of the present disclosure.

On the basis of the previous embodiment, FIG. 2 is a top view illustrating the structure of a display panel according to an embodiment of the present disclosure. Referring to FIG. 2, the display panel 10 further includes a plurality of sub-pixels 101 arranged in an array. The sub-pixels 101 includes a plurality of first sub-pixels 1011 arranged in an array in the first display region 11, a plurality of second sub-pixels 1012 arranged in an array in the second display region 12 and a plurality of third sub-pixels 1013 arranged in an array in the third display region 13. The third display region 13 is located between the first display region 11 and the second display region 12.

In an embodiment, the display panel 10 includes a plurality of sub-pixels 101 arranged in an array. One sub-pixel 101 may include a red sub-pixel, a green sub-pixel and a blue sub-pixel. The sub-pixels 101 emit light to achieve the normal display. In an embodiment, the sub-pixels 101 include a plurality of first sub-pixels 1011 arranged in an array in the first display region 11. One first sub-pixel 1011 may include a red sub-pixel, a green sub-pixel and a blue sub-pixel. The first sub-pixels 1011 emit light to achieve the normal display of the first display region 11. Further, the sub-pixels 101 further include a plurality of second sub-pixels 1012 arranged in an array in the second display region 12. One second sub-pixel 1012 may include a red sub-pixel, a green sub-pixel and a blue sub-pixel. The second sub-pixels 1012 emit light to achieve the normal display of the second display region 12. Further, the sub-pixels 101 further include a plurality of third sub-pixels 1013 arranged in an array in the third display region 13. One third sub-pixel 1013 may include at least one sub-pixel with light-emitting color. The third sub-pixels 1013 emit light to achieve the normal display of the third display region 13. In one embodiment, the third sub-pixels 1013 emit light in cooperation with the first sub-pixels 1011 and/or the second sub-pixels 1012 to achieve the normal display of the third display region 13. On this basis, the first display region 11, the third display region 13 and the second display region 12 are disposed in sequence, that is, the third display region 13 is located between the first display region 11 and the second display region 12. The first display region 11, the second display region 12 and the third display region 13 cooperate with each other for display to ensure that the display panel 10 can display a complete image. As a result, the display effect of the display panel is ensured.

It is to be noted that as seen from the top view shown in FIG. 2, the third display region 13 overlaps with the non-display region NAA. Therefore, the boundary of the first display region 11 facing the third display region and the boundary of the second display region 12 facing the third display region cannot be seen from the top view shown in FIG. 2. FIG. 2 shows the boundary of the first display region 11 facing the third display region 13 and the boundary of the second display region 12 facing the third display region 13 with dotted lines, and the same representation is adopted in the following drawings and is not described again.

Next, how the first display region, the second display region and the third display region cooperate to display the complete image is described below.

First, a description is given by using an example in which the first display region, the second display region and the third display region each include a complete pixel unit.

Continuing to refer to FIG. 2, the first display region 11 includes a plurality of first pixel units 111 arranged in an array; the second display region 12 includes a plurality of second pixel units 112 arranged in an array; and the third display region 13 includes a plurality of third pixel units 113 arranged in an array. The pixel arrangement of first sub-pixels 1011 in one first pixel unit 111 is the same as the pixel arrangement of third sub-pixels 1013 in one third pixel unit 113. In one embodiment, the pixel arrangement of second sub-pixels 1012 in one second pixel unit 112 is the same as the pixel arrangement of the third sub-pixels 1013 in one third pixel unit 113.

In an embodiment, the first display region 11 includes a plurality of first pixel units 111 arranged in an array. One first pixel unit 111 includes at least two first sub-pixels 1011. A description is given with reference to FIG. 2 by using an example in which one first pixel unit 111 includes three first sub-pixels 1011. The three first sub-pixels 1011 may be a red light sub-pixel, a green light sub-pixel and a blue light sub-pixel respectively to ensure that the first pixel units 111 and the first display region 11 can achieve the color display. Further, the second display region 12 includes a plurality of second pixel units 112 arranged in an array. One second pixel unit 112 includes at least two second sub-pixels 1012. A description is given with reference to FIG. 2 by using an example in which one second pixel unit 112 includes three second sub-pixels 1012. The three second sub-pixels 1012 may be a red light sub-pixel, a green light sub-pixel and a blue light sub-pixel respectively to ensure that the second pixel units 112 and the second display region 12 can achieve the color display. Further, the third display region 13 includes a plurality of third pixel units 113 arranged in an array. One third pixel unit 113 includes at least two third sub-pixels 1013. A description is given with reference to FIG. 2 by using an example in which one third pixel unit 113 includes three third sub-pixels 1013. The three third sub-pixels 1013 may be a red light sub-pixel, a green light sub-pixel and a blue light sub-pixel respectively to ensure that the third pixel units 113 and the third display region 13 can achieve the color display. In this manner, each of three display regions includes independent and complete pixel units. The pixel units in each display region can emit light independently to ensure that each display region can be displayed independently, and the display panels of the three display regions are tiled to obtain a complete display image.

It is to be noted that a description is given with reference to FIG. 2 by using an example in which each pixel unit includes three third sub-pixels. It can be understood that this embodiment of the present disclosure does not limit the number of the sub-pixels included in the pixel units. In an embodiment, each pixel unit may further include two sub-pixels with different light-emitting colors to achieve the color display through pixel borrowing. Further, in the case where each pixel unit includes two sub-pixels with different light-emitting colors, there may be a variety of arrangements for each pixel unit and sub-pixels between pixel units, such as a triangle-shaped arrangement or a "diamond" arrangement. This is not limited in this embodiment of the present disclosure. In one embodiment, the arrangements of the sub-pixels in the embodiment described later are the same, and are not repeated in the embodiment described later.

Next, a description is given by using an example in which the third display region includes incomplete pixel units and needs to cooperate with other display regions to achieve display.

Figure 3:
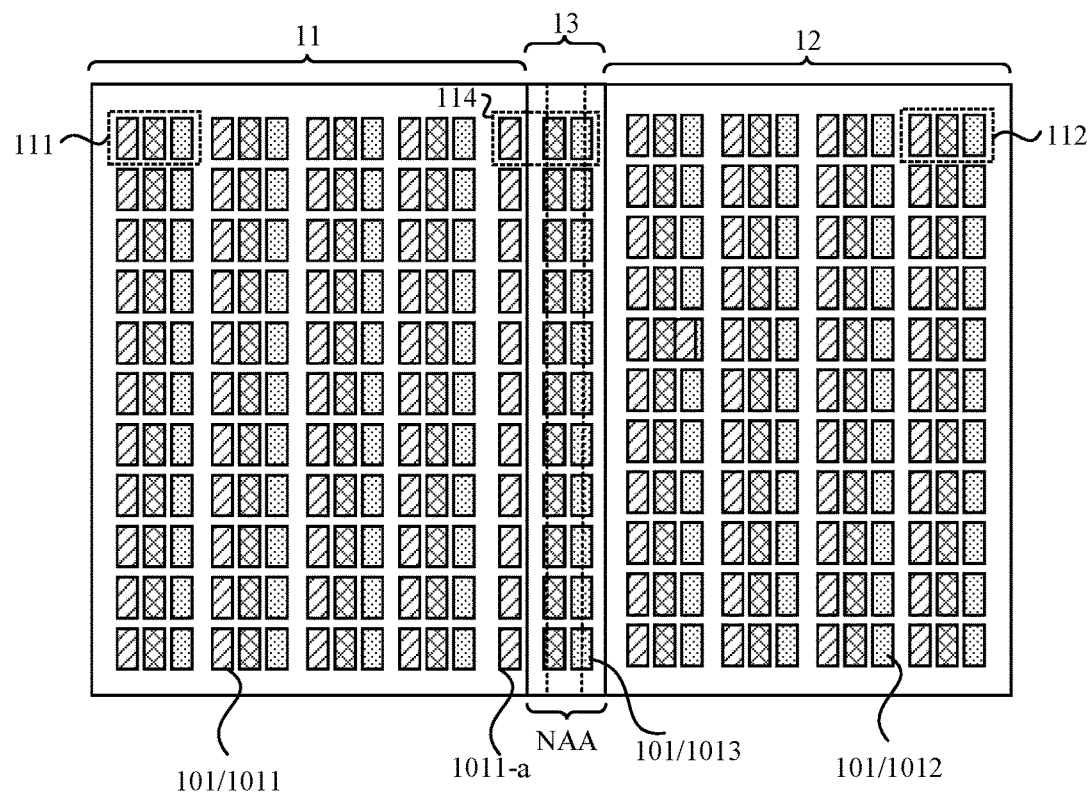
FIG. 3 is a top view illustrating the structure of another display panel according to an embodiment of the present disclosure.
Figure 4:
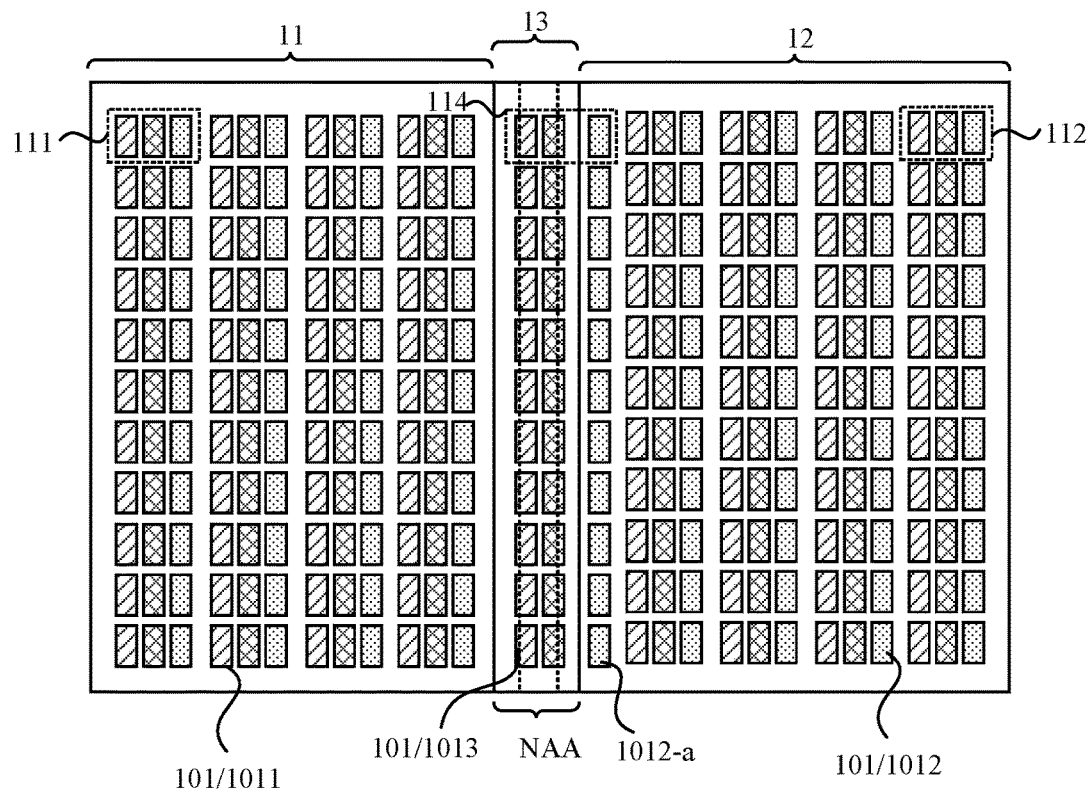
FIG. 4 is a top view illustrating the structure of another display panel according to an embodiment of the present disclosure.
Figure 5:
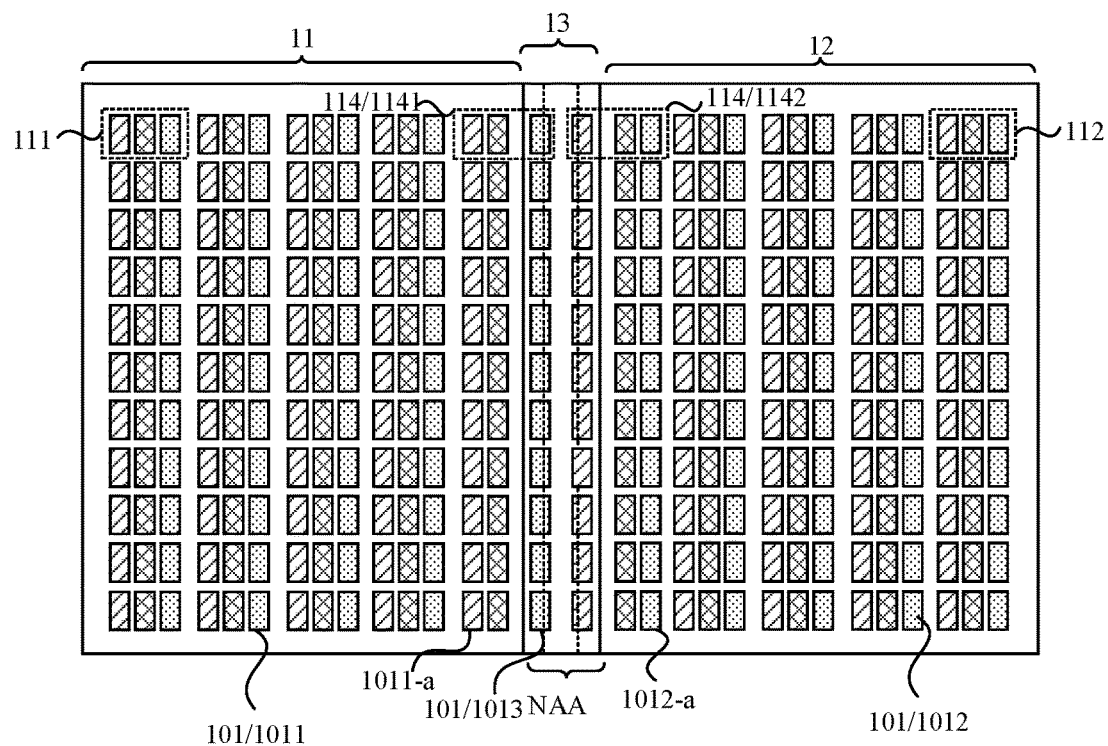
FIG. 5 is a top view illustrating the structure of another display panel according to an embodiment of the present disclosure.
Figure 6:
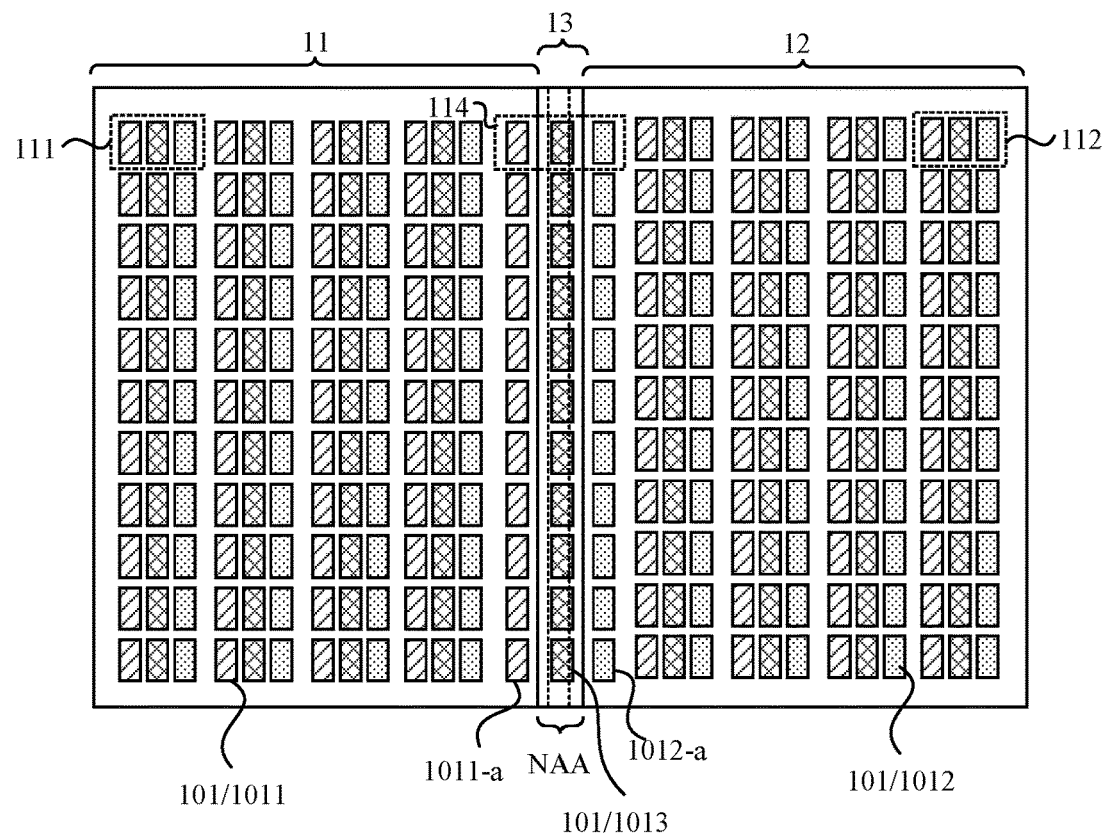
FIG. 6 is a top view illustrating the structure of another display panel according to an embodiment of the present disclosure.

FIG. 3 is a top view illustrating the structure of another display panel according to an embodiment of the present disclosure. FIG. 4 is a top view illustrating the structure of another display panel according to an embodiment of the present disclosure. FIG. 5 is a top view illustrating the structure of another display panel according to an embodiment of the present disclosure. FIG. 6 is a top view illustrating the structure of another display panel according to an embodiment of the present disclosure. As shown in FIGS. 3 to 6, the first display region 11 includes a plurality of first pixel units 111 arranged in an array and a plurality of first boundary sub-pixels 1011-a on a side of the first display region facing the third display region. The first boundary sub-pixels 1011-a and at least part of the third sub-pixels 1013 on a side of the third display region facing the first display region 11 form boundary pixel units 114. The sub-pixel arrangement of first sub-pixels 1011 in one first pixel unit 111 is the same as the sub-pixel arrangement of sub-pixels in one boundary pixel unit 114. In one embodiment, the second display region 12 includes a plurality of second pixel units 112 arranged in an array and a plurality of second boundary sub-pixels 1012-a on a side of the second display region facing the third display region 13. The second boundary sub-pixels 1012-a and at least part of the third sub-pixels 1013 on a side of the third display region facing the second display region 12 form boundary pixel units 114. The sub-pixel arrangement of second sub-pixels 1012 in one second pixel unit 112 is the same as the sub-pixel arrangement of the sub-pixels in one boundary pixel unit 114.

In an embodiment, a description is given with reference to FIG. 3 by using an example in which the first boundary sub-pixels 1011-a and the third sub-pixels 1013 form the boundary pixel units 114. A description is given with reference to FIG. 4 by using an example in which the second boundary sub-pixels 1012-a and the third sub-pixels 1013 form the boundary pixel units 114. A description is given with reference to FIG. 5 by using an example in which the first boundary sub-pixels 1011-a and part of the third sub-pixels 1013 form the boundary pixel units 114, and at the same time, the second boundary sub-pixels 1012-a and part of the third sub-pixels 1013 form the boundary pixel units 114. A description is given with reference to FIG. 2 by using an example in which the first boundary sub-pixels 1011-a, the third sub-pixels 1013 and the second boundary sub-pixels 1012-a form the boundary pixel units 114.

As shown in FIG. 3, the first display region 11 includes a plurality of complete first pixel units 111 and the first boundary sub-pixels 1011-a on a side of the first display region facing the third display region 13. The first boundary sub-pixels 1011-a cannot form the complete first pixel units, and at the same time, the third sub-pixels in the third display units 13 further include the third sub-pixels 1013 that cannot achieve complete third pixel units. Therefore, the first boundary sub-pixels 1011-a and at least part of the third sub-pixels 1013 on a side of the third display region facing the first display region 11 form the boundary pixel units 114. Complete boundary pixel units 114 are achieved through the cooperation of part of the first sub-pixels 1011 in the first display region 11 and at least part of the third sub-pixels 1013 in the third display region 13 to ensure that the handover region between the first display region 11 and the third display region 13 can normally achieve the color display. As a result, good display effect of the display panel is ensured.

As shown in FIG. 4, the second display region 12 includes a plurality of complete second pixel units 112 and the second boundary sub-pixels 1012-a on a side of the second display region facing third display region 13. The second boundary sub-pixels 1012-a cannot form the complete second pixel units, and at the same time, the third sub-pixels in the third display unit 13 further include the third sub-pixels 1013 that cannot achieve the complete third pixel units. Therefore, the second boundary sub-pixels 1012-a and at least part of the third sub-pixels 1013 on a side of the third display region facing the second display region 12 form the boundary pixel units 114. The complete boundary pixel units 114 are achieved through the cooperation of part of the second sub-pixels 1012 in the second display region 12 and at least part of the third sub-pixels 1013 in the third display region 13 to ensure that the handover region between the second display region 12 and the third display region 13 can normally achieve the color display. As a result, the good display effect of the display panel is ensured.

As shown in FIG. 5, the first display region 11 includes a plurality of complete first pixel units 111 and the first boundary sub-pixels 1011-a on a side of the first display region facing third display region 13. The first boundary sub-pixels 1011-a cannot form the complete first pixel units. The second display region 12 includes a plurality of complete second pixel units 112 and the second boundary sub-pixels 1012-a on a side of the second display region facing third display region 13. The second boundary sub-pixels 1012-a cannot form the complete second pixel units, and at the same time, the third sub-pixels in the third display units 13 further include the third sub-pixels 1013 that cannot achieve the complete third pixel units. Therefore, the first boundary sub-pixels 1011-a and at least part of the third sub-pixels 1013 on a side of the third display region facing the first display region 11 form the boundary pixel units 114, such as the first boundary pixel units 1141 shown in the figure. At the same time, the second boundary sub-pixel 1012-a and at least part of the third sub-pixels 1013 on a side of the third display region facing the second display region 12 form the boundary pixel units 114, such as a second boundary pixel unit 1142 shown in the figure. The complete first boundary pixel units 1141 are achieved through the cooperation of part of the first sub-pixels 1011 in the first display region 11 and at least part of the third sub-pixels 1013 in the third display region 13 to ensure that the handover region between the first display region 11 and the third display region 13 can normally achieve the color display. As a result, the good display effect of the display panel is ensured. At the same time, the complete second boundary pixel units 1142 are achieved through the cooperation of part of the second sub-pixels 1012 in the second display region 12 and at least part of the third sub-pixels 1013 in the third display region 13 to ensure that the handover region between the second display region 12 and the third display region 13 can normally achieve the color display. As a result, the good display effect of the display panel is ensured.

As shown in FIG. 6, the first display region 11 includes a plurality of complete first pixel units 111 and the first boundary sub-pixels 1011-a on a side of the first display region facing the third display region 13. The first boundary sub-pixels 1011-a cannot form the complete first pixel units. The second display region 12 includes a plurality of complete second pixel units 112 and the second boundary sub-pixels 1012-a on a side of the second display region facing the third display region 13. The second boundary sub-pixels 1012-a cannot form the complete second pixel units, and at the same time, the third sub-pixels in the third display units 13 further include the third sub-pixels 1013 that cannot achieve the complete third pixel units. Therefore, the first boundary sub-pixels 1011-a, the second boundary sub-pixels 1012-a and the third sub-pixels 1013 form the boundary pixel units. The complete boundary pixel units 114 are achieved through the cooperation of part of the first sub-pixels 1011 in the first display region 11, part of the second sub-pixels 1012 in the second display region 12 and all the third sub-pixels 1013 in the third display region 13 to ensure that the handover region between the first display region 11 and the third display region 13 and the handover region between the second display region 12 and the third display region 13 can normally achieve the color display. As a result, the good display effect of the display panel is ensured.

In summary, the previous embodiment reasonably disposes the pixel unit and the sub-pixel in the three display regions to ensure that the three display regions can cooperate to display the complete image. As a result, the good display effect of the display panel is ensured.

Figure 7:
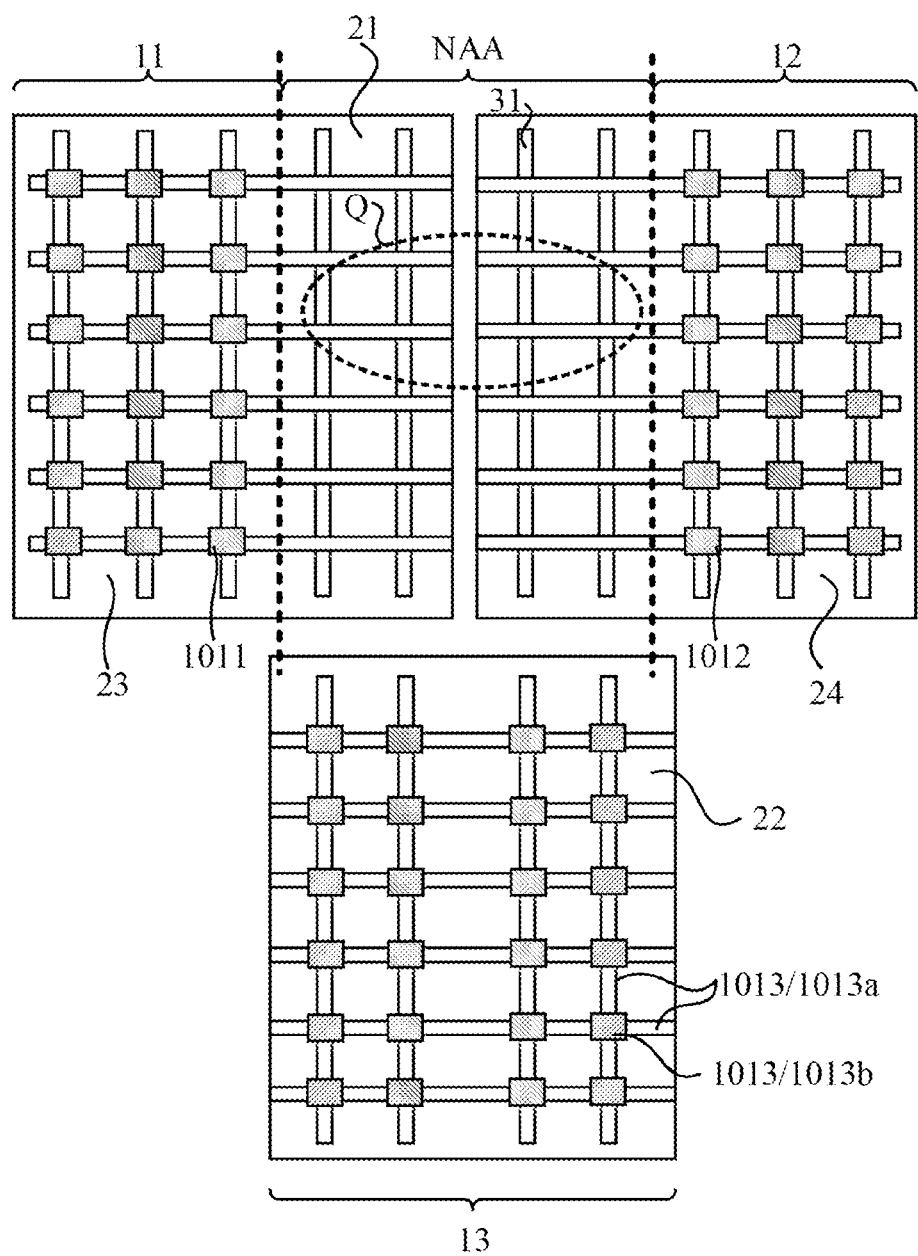
FIG. 7 is a top view illustrating the structure of another display panel according to an embodiment of the present disclosure.

On the basis of the preceding embodiment, FIG. 7 is a top view illustrating the structure of another display panel according to an embodiment of the present disclosure. As shown in FIG. 7, the non-display region NAA includes a first light-transparent region 21, and the third display region 13 further includes a second light-transparent region 22. The first light-transparent region 21 and the second light-transparent region 22 at least partially overlap in the light emission direction of the display panel 10.

In an embodiment, in the display panel according to this embodiment of the present disclosure, the third display region 13 can achieve the transparent display. For example, the third display region 13 may be a fingerprint recognition region or a camera disposition region to ensure the achievement of fingerprint recognition function or imaging function. The third display region 13 and the non-display region NAA at least partially overlap in the light emission direction of the display panel. Therefore, to achieve the transparent display function of the third display region 13, the first light-transparent region 21 may be disposed in the non-display region NAA, and the second light-transparent region 22 may be disposed in the third display region 13. In one embodiment, the first light-transparent region 21 and the second light-transparent region 22 at least partially overlap in the light emission direction of the display panel. The transparent display function of the third display region 13 is achieved through the first light-transparent region 21 and the second light-transparent region 22 to ensure the functional diversification of the display panel.

It is to be noted that the third display region 13 and the non-display region NAA at least partially overlap in the light emission direction of the display panel, as shown in FIG. 1. For ease of understanding, FIG. 7 shows that the third display region 13 and the non-display region NAA are staggered only to show the arrangement of the first light-transparent region 21 and the arrangement of second light-transparent region 22.

On the basis of the previous embodiment, continuing to refer to FIG. 7, the first display region 11 may be further configured to include a third light-transparent region 23. For example, the third light-transparent region 23 may be the fingerprint recognition region or the camera disposition region to ensure that the fingerprint recognition function or the imaging function of the first display region 11 can be achieved. Further, the arrangement of the second light-transparent region 22 is the same as the arrangement of the third light-transparent region 23. Therefore, the arrangement of the light-transparent region in the first display region 11 is the same as the arrangement of the light-transparent region in the third display region 13 to ensure that the display effect of the first display region 11 is the same as the display effect of the third display region 13. As a result, the good display uniformity of the display panel is ensured.

In one embodiment, continuing to refer to FIG. 7, the second display region 12 may be further configured to include a fourth light-transparent region 24. For example, the fourth light-transparent region 24 may be the fingerprint recognition region or the camera disposition region to ensure that the fingerprint recognition function or the imaging function of the second display region 12 can be achieved. Further, the arrangement of the second light-transparent region 22 is the same as the arrangement of the fourth light-transparent region 24. Therefore, the arrangement of the light-transparent region in the second display region 12 is the same as the arrangement of the light-transparent region in the third display region 13 to ensure that the display effect of the second display region 12 is the same as the display effect of the third display region 13. As a result, the good display uniformity of the display panel is ensured.

It is to be noted that a description is given with reference to FIG. 7 by using merely an example in which the first display region includes the third light-transparent region, and at the same time, the second display region includes the fourth light-transparent region. It can be understood that the light-transparent region may be disposed only in the first display region or only in the second display region. This is not limited in this embodiment of the present disclosure.

Figure 8:
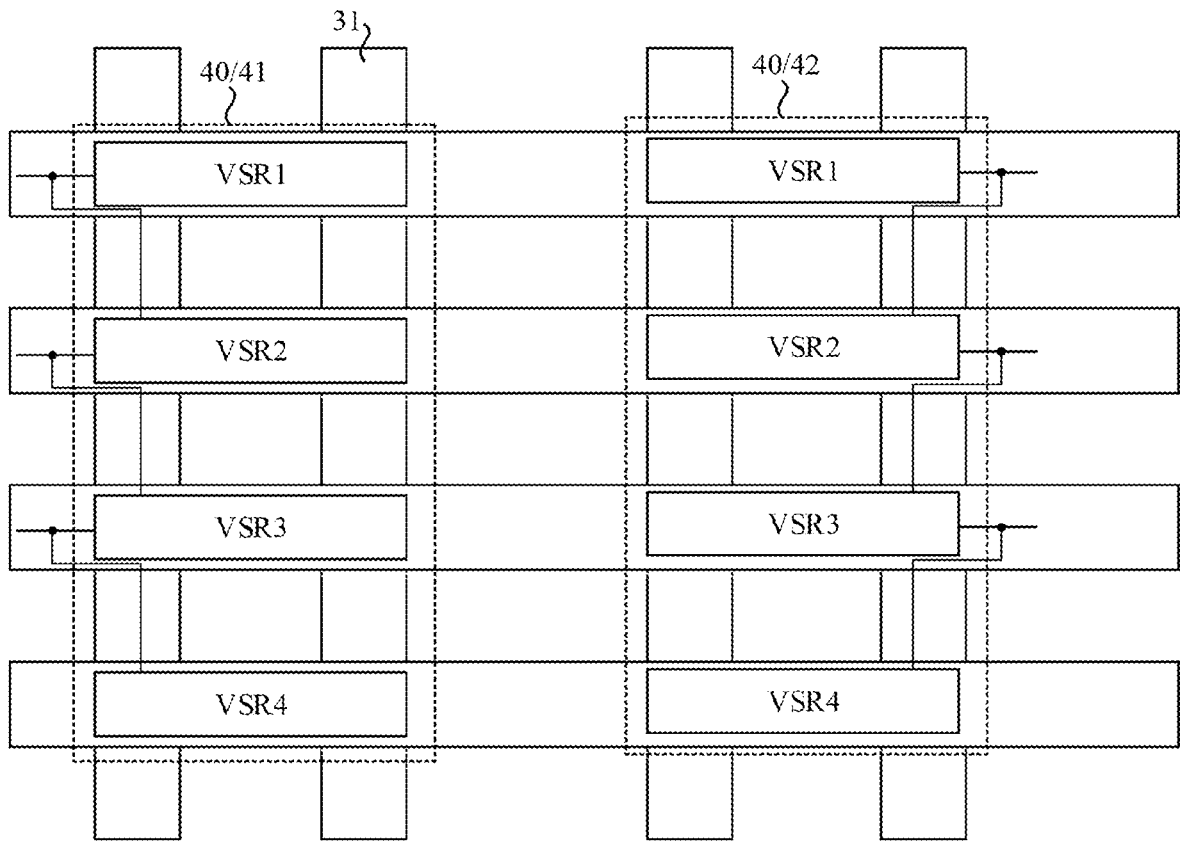
FIG. 8 is an enlarged view illustrating the structure of the Q region in the display panel of FIG. 7.

On the basis of the previous embodiment, FIG. 8 is an enlarged view illustrating the structure of the Q region in the display panel of FIG. 7. As shown in FIGS. 7 and 8, the non-display region NAA further includes a light-nontransparent region 31. The light-nontransparent region 31 includes a pixel driving circuit. The pixel driving circuit 40 includes a first pixel driving circuit 41 and a second pixel driving circuit 42. The first display region 11 includes a plurality of first sub-pixels 1011 arranged in an array. One first sub-pixel includes a first pixel circuit and a first light-emitting element (not shown). The second display region 12 includes a plurality of second sub-pixels 1012 arranged in an array. One second sub-pixel includes a second pixel circuit and a second light-emitting element (not shown). The first pixel driving circuit 41 is configured to provide a driving signal for the first pixel circuit. The second pixel driving circuit 42 is configured to provide the driving signal for the second pixel circuit.

In an embodiment, one first sub-pixel includes a first pixel circuit and a first light-emitting element, and one second sub-pixel includes a second pixel circuit and a second light-emitting element. The first light-emitting element and the second light-emitting element may be light-emitting elements of an active driving type. A display signal (such as a data signal and a power signal) is provided for the light-emitting element by the pixel circuit to drive the light-emitting element for light-emitting display.

Further, the light-emitting element may be a light-emitting diode, such as an organic light-emitting diode or a micro light-emitting diode, and this embodiment of the present disclosure does not limit the type of the light-emitting diode. Further, the pixel circuit may include a plurality of thin-film transistors and at least one storage capacitor, such as a 2T1C (two thin-film transistors and one storage capacitor) pixel circuit or a 7T1C (seven thin-film transistors and one storage capacitor) pixel circuit to ensure that the display signal can be transmitted to the light-emitting element normally.

Further, the operation of the pixel circuit requires the pixel driving circuit to provide the driving signal, such as a scan signal and a light-emitting control shift register circuit signal. Therefore, the non-display region NAA may be used as a circuit disposition region. For example, the non-display region NAA is disposed with the pixel driving circuit 40. The first pixel driving circuit 40 is configured to provide the driving signal for the pixel circuit in the display region to ensure the normal operation of the pixel circuit and to ensure the normal light-emitting of the light-emitting element. As a result, the normal display of the display panel is ensured. Further, the pixel driving circuit 40 may be disposed in the light-nontransparent region 31 in the non-display region NAA to ensure that the driving signal can be provided for the pixel circuit of the display region on the premise of ensuring the transparent display of the third display region 13. Corresponding to the case of the first display region and the case of the second display region, the pixel driving circuit 40 may include a first pixel driving circuit 41 and a second pixel driving circuit 42. The first pixel driving circuit 41 is configured to provide the driving signal for the first pixel circuit in the first display region. The second pixel driving circuit 42 is configured to provide the driving signal for the second pixel circuit in the second display region. In this manner, the normal operation of the first pixel circuit and the normal operation of the second pixel circuit can be ensured; the first light-emitting element and the second light-emitting element can emit light normally; and the first display region and the second display region can be displayed normally. As a result, the normal operation of the display panel is ensured.

It is to be noted that the first display region may be an independent display region. The display panel may further include a first non-display region that surrounds the first display region. The first non-display region may include a first bezel region on the side of the first display region facing the third display region and a second bezel region on the side of the first display region facing away from the third display region. The first pixel driving circuit may be disposed in the first bezel region and the second bezel region. The first bezel region here is part of the non-display region in the preceding embodiment, and may be part of the non-display region facing the first display region. Similarly, the second display region may be the independent display region. The display panel may further include a second non-display region that surrounds the second display region. The second non-display region may include a third bezel region on the side of the second display region facing the third display region and a fourth bezel region on the side of the second display region facing away from the third display region. The second pixel driving circuit may be disposed in the third bezel region and the fourth bezel region. The third bezel region here is part of the non-display region in the preceding embodiment, and may be part of the non-display region facing the second display region.

On the basis of the preceding embodiment, how to dispose the pixel driving circuit in the light-nontransparent region to ensure that the first light-transparent region exists in the non-display region and that the third display region can achieve the transparent display is be described below.

Figure 9:
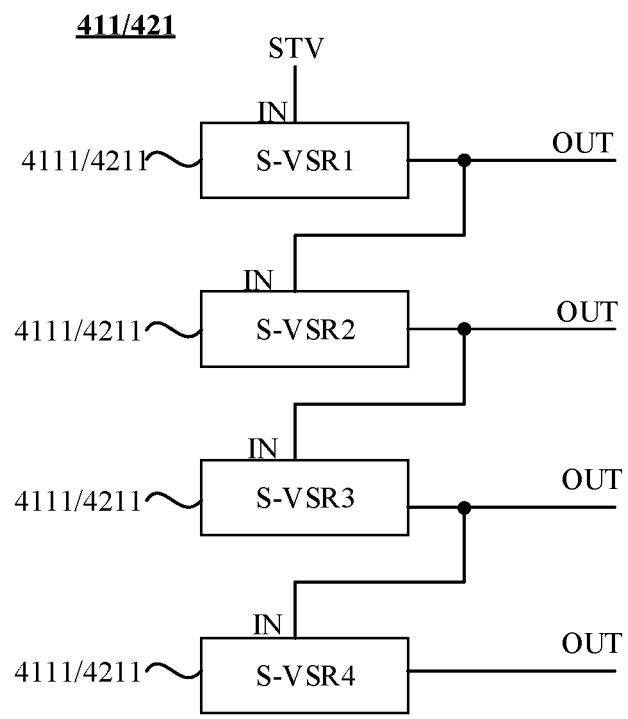
FIG. 9 is a view illustrating the structure of a scan driving circuit according to an embodiment of the present disclosure.
Figure 10:
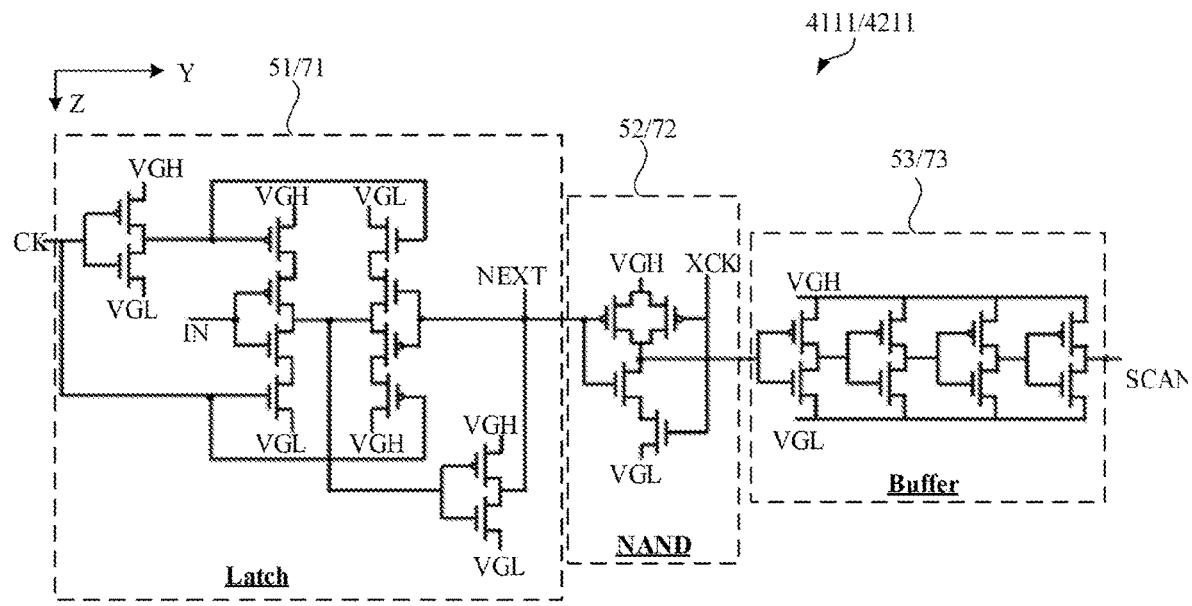
FIG. 10 is a view illustrating the structure of a scan shift register circuit according to an embodiment of the present disclosure.
Figure 11:
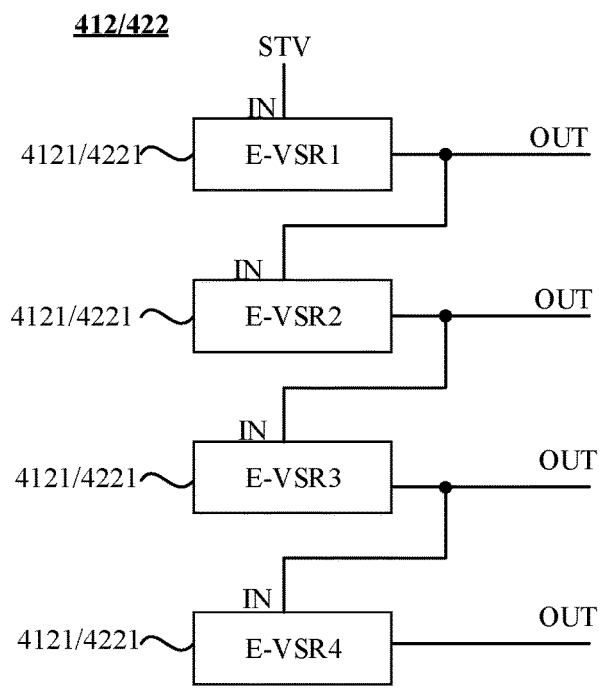
FIG. 11 is a view illustrating the structure of a light-emitting control driving circuit according to an embodiment of the present disclosure.
Figure 12:
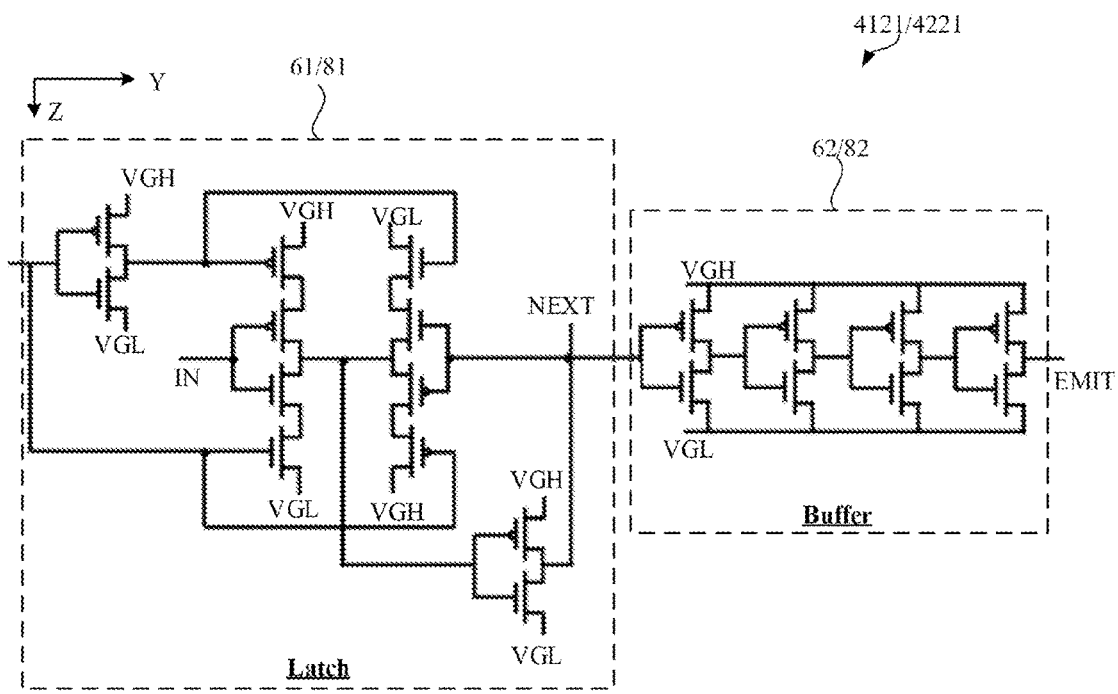
FIG. 12 is a view illustrating the structure of a light-emitting control shift register circuit according to an embodiment of the present disclosure.

FIG. 9 is a view illustrating the structure of a scan driving circuit according to an embodiment of the present disclosure. FIG. 10 is a view illustrating the structure of a scan shift register circuit according to an embodiment of the present disclosure. FIG. 11 is a view illustrating the structure of a light-emitting control driving circuit according to an embodiment of the present disclosure. FIG. 12 is a view illustrating the structure of a light-emitting control shift register circuit according to an embodiment of the present disclosure. As shown in FIGS. 9 to 12, the first pixel driving circuit 41 includes a first scan driving circuit 411 and a first light-emitting control driving circuit 412. The first scan driving circuit 411 includes first scan shift register circuits 4111 disposed in a multi-stage cascade. The first light-emitting control driving circuit 412 includes first light-emitting control shift register circuits 4121 disposed in a multi-stage cascade. One first scan shift register circuit 4111 includes a first latch device 51, a first logic device 52 and a first buffer device 53. The first latch device 51, the first logic device 52 and the first buffer device 53 are arranged in a first direction (the Y-direction as shown in the figure). The first direction is parallel to the direction in which the first display region points to the second display region. One first light-emitting control shift register circuit 4121 includes a second latch device 61 and a second buffer device 62. The second latch device 61 and the second buffer device 62 are arranged in the first direction (the Y-direction as shown in the figure).

As shown in FIGS. 9 and 11, the first pixel driving circuit 41 includes a first scan driving circuit 411 and a first light-emitting control driving circuit 412. The first scan driving circuit 411 includes first scan shift register circuits 4111 disposed in a multi-stage cascade. The output terminal OUT of one first scan shift register circuit 4111 at the current stage is electrically connected to the corresponding pixel circuit and the input terminal IN of one first scan shift register circuit 4111 at the next stage at the same time. In this manner, scan signals can be provided for pixel circuits line by line to ensure the normal operation of the pixel circuits. Similarly, the first light-emitting control driving circuit 412 includes first light-emitting control shift register circuits 4121 disposed in a multi-stage cascade. The output terminal OUT of one first light-emitting control shift register circuit 4121 at the current stage is electrically connected to the corresponding pixel circuit and the input terminal IN of one first light-emitting control shift register circuit 4121 at the next stage at the same time. In this manner, the light-emitting control shift register circuit signals can be provided for the pixel circuits line by line to ensure the normal operation of the pixel circuits.

Further, to dispose the first light-transparent region in the non-display region NAA, the pixel driving circuit may be designed in a modular manner. Through the modular design, the first light-transparent region is reserved for the non-display region NAA to achieve the transparent display of the third display region.

In an embodiment, as shown in FIG. 10, one first scan shift register circuit 4111 includes a first latch device 51, a first logic device 52 and a first buffer device 53. The first latch device 51, the first logic device 52 and the first buffer device 53 are arranged in the first direction (the Y-direction as shown in the figure). In this embodiment of the present disclosure, one first scan shift register circuit 4111 includes a first latch device 51, a first logic device 52 and a first buffer device 53, and the first latch device 51, the first logic device 52 and the first buffer device 53 are arranged in the first direction (the Y-direction as shown in the figure). In this manner, the lengths of the space occupied by the first scan shift register circuits 4111 in a second direction (the Z-direction as shown in the figure) can be reduced, and disposition space is reserved for the first light-transparent region. It is to be noted that one first scan shift register circuit 4111 is not limited to being divided into the first latch device 51, the first logic device 52 and the first buffer device 53. In some embodiments, one first scan shift register circuit 4111 may be divided into several devices as needed. This is not limited in this embodiment of the present disclosure. One first scan shift register circuit 4111 may be divided into a first latch device 51, a first logic (NAND) device 52 and a first buffer device 53 in the manner shown in FIG. 10, and the working principle is not described in detail here.

It is to be noted that one first scan shift register circuit shown in FIG. 10 is only a schematic circuit and is not for the purpose of limiting. In some embodiments, any known scan shift register circuit may be adopted and divide it into several small devices to reduce the lengths of the space occupied by the first scan shift register circuits in the second direction. The scan shift register circuit of other structure belongs to the scope of this embodiment of the present disclosure as long as the scan shift register circuit of other structure includes the latch device, the logic device and the buffer device in function division.

Further, as shown in FIG. 12, one first light-emitting control shift register circuit 4121 includes a second latch device 61 and a second buffer device 62. The second latch device 61 and the second buffer device 62 are arranged in the first direction. In this embodiment of the present disclosure, one first light-emitting control shift register circuit 4121 is divided into a second latch device 61 and a second buffer device 62, and the second latch device 61 and the second buffer device 62 are arranged in the first direction (the Y-direction as shown in the figure). In this manner, the lengths of the space occupied by the first light-emitting control shift register circuits 4121 in the second direction (the Z-direction as shown in the figure) can be reduced, and the arrangement space is reserved for the first light-transparent region. It is to be noted that one first light-emitting control shift register circuit 4121 is not limited to being divided into a second latch device 61 and a second buffer device 62. In some embodiments, one first light-emitting control shift register circuit 4121 may be divided into several devices as needed. This is not limited in this embodiment of the present disclosure. The first light-emitting control shift register circuit 4121 may be divided into a second latch device 61 and a second buffer device 62 in the manner shown in FIG. 12, and the working principle is not described in detail here.

It is to be noted that one first light-emitting control shift register circuit 4121 shown in FIG. 12 is only the schematic circuit and is not for the purpose of limiting. In some embodiments, any known light-emitting control shift register circuit may be adopted and divide it into several small devices to reduce the lengths of the space occupied by the first light-emitting control shift register circuits 4121 in the second direction. The light-emitting control shift register circuit of other structure belongs to the scope of this embodiment of the present disclosure as long as the light-emitting control shift register circuit of other structure includes the latch device and the buffer device in function division.

Continuing to refer to FIGS. 9 to 12, the second pixel driving circuit 42 includes a second scan driving circuit 421 and a second light-emitting control driving circuit 422. The second scan driving circuit 421 includes second scan shift register circuits 4211 disposed in a multi-stage cascade. The second light-emitting control driving circuit 422 includes second light-emitting control shift register circuits 4221 disposed in a multi-stage cascade. One second scan shift register circuit 4211 includes a third latch device 71, a second logic device 72 and a third buffer device 73. The third latch device 71, the second logic device 72 and the third buffer device 73 are arranged in the first direction. One second light-emitting control shift register circuit 4221 includes a fourth latch device 81 and a fourth buffer device 82. The fourth latch device 81 and the fourth buffer device 82 are arranged in the first direction. The arrangement of the second pixel driving circuit 42 is the same as the arrangement of the first pixel driving circuit 41, and the details are not repeated here.

In summary, through the modular design of the scan driving circuit and the modular design of the light-emitting control driving circuit in the pixel driving circuit, the arrangement space of the first light-transparent region can be cleverly reserved in the non-display region to achieve the transparent display of the third display region and to ensure the functional diversification of the display panel.

On the basis of the previous embodiment, continuing to refer to FIG. 7, the first display region 13 includes a plurality of third sub-pixels 1013 arranged in an array. One third sub-pixel 1013 includes an electrode signal line 1013a and a third light-emitting element 1013b. The electrode signal line 1013a is configured to provide an anode signal and a cathode signal for the third light-emitting element 1013b. The non-display region NAA further includes a light-non-transparent region 31. The electrode signal line 1013a and the light-nontransparent region 31 at least partially overlap in the light emission direction of the display panel.

In an embodiment, to achieve the transparent display of the third display region 13, the third light-emitting element 1013b may be disposed as a passive driving element, that is, the third light-emitting element 1013b does not need the data signal to emit light. A corresponding anode voltage signal can be provided for the anode of the third light-emitting element 1013b and a corresponding cathode voltage signal can be provided for the cathode of the third light-emitting element 1013b. The third light-emitting element 1013b is driven to emit light by the anode voltage signal and the cathode voltage signal. In this manner, there is no need to dispose the pixel circuit and the pixel driving circuit in the third display region 13. Therefore, the arrangement space of the second light-transparent region 22 in the third display region 13 can be reserved, and the transparent display of the third display region 13 can be achieved. In an embodiment, one third sub-pixel 1013 includes an electrode signal line 1013a. The electrode signal line 1013a may include an anode signal line and a cathode signal line. The anode signal line is electrically connected to the anode of the third light-emitting element 1013b for transmitting the anode voltage signal to the anode of the third light-emitting element 1013b. The cathode signal line is electrically connected to the cathode of the third light-emitting element 1013b for transmitting the cathode voltage signal to the cathode of the third light-emitting element 1013b. In this manner, the third light-emitting element 1013b can emit light.

Further, since the electrode signal line 1013a is generally a metal wire and has poor light-transmissive performance, the electrode signal line 1031a and the light-nontransparent region 31 may be configured to at least partially overlap in the light emission direction of the display panel, that is, the light-nontransparent region in the third display region 13 and the light-nontransparent region in the non-display region NAA at least partially overlap. In this manner, the area of the light-transparent region in the third display region 13 can be increased. As a result, good transparent display effect of the third display region is ensured.

Figure 13:
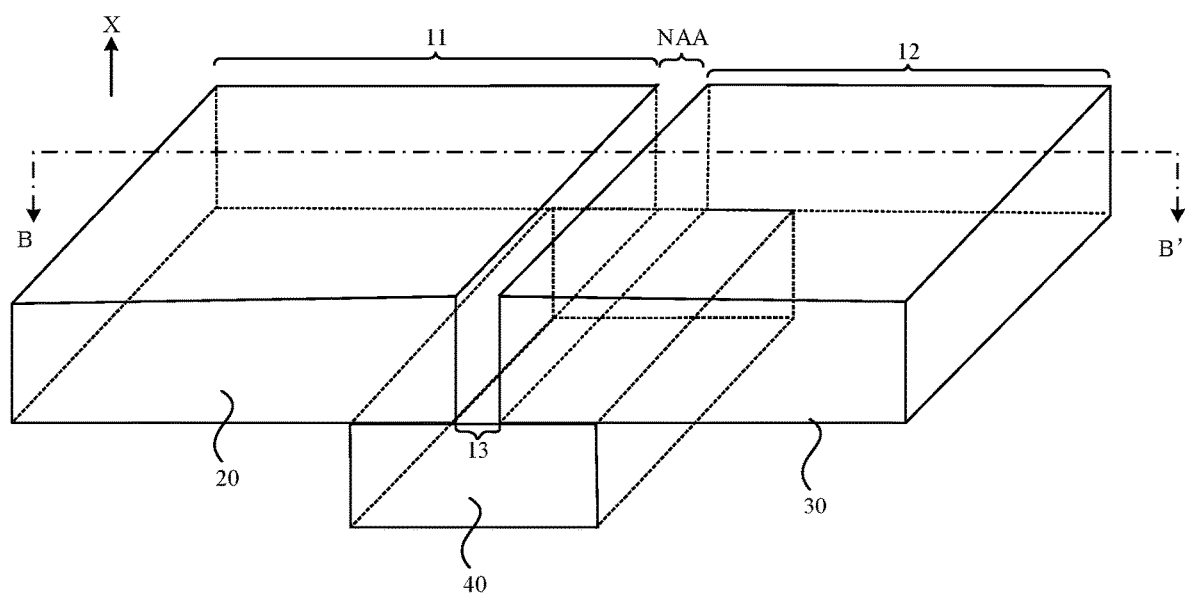
FIG. 13 is a view illustrating the structure of another display panel according to an embodiment of the present disclosure.

On the basis of the preceding embodiment, FIG. 13 is a view illustrating the structure of another display panel according to an embodiment of the present disclosure. As shown in FIGS. 1 and 13, the display panel 10 includes a first display subpanel 20, a second sub-display 30 panel and a third display subpanel 40. The first display subpanel 20 includes the first display region 11. The second display subpanel 30 includes the second display region 12. The third display subpanel 40 includes the third display region 13. The third display subpanel 40 covers the joint between the first display subpanel 20 and the second display subpanel 30.

In an embodiment, the display panel 10 may be the tiled display panel, that is, the first display subpanel 20 and the second display subpanel 30 are spliced to obtain the infrastructure of the display panel 10. The third display subpanel 40 covers the joint between the first display subpanel 20 and the second display subpanel 30 to ensure that the non-display region between the first display region 11 and the second display region 11 is invisible. In this manner, the problem that the joint is visible can be eliminated. Therefore, the display effect of the display panel 10 can be improved. In one embodiment, the third display subpanel 40 is configured to cover the joint between the first display subpanel 20 and the second display subpanel 30 to add the third display region. Therefore, the display area of the display panel can also be improved, and the display effect can further be improved. As a result, the tiled display panel with good display effect can be ensured.

Figure 14:
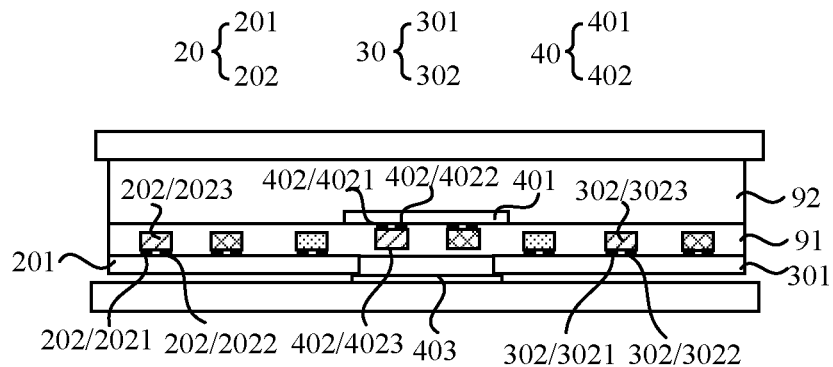
FIG. 14 is a section view taken along section line AA' of FIG. 1 to illustrate the structure of the display panel of FIG. 1.
Figure 15:
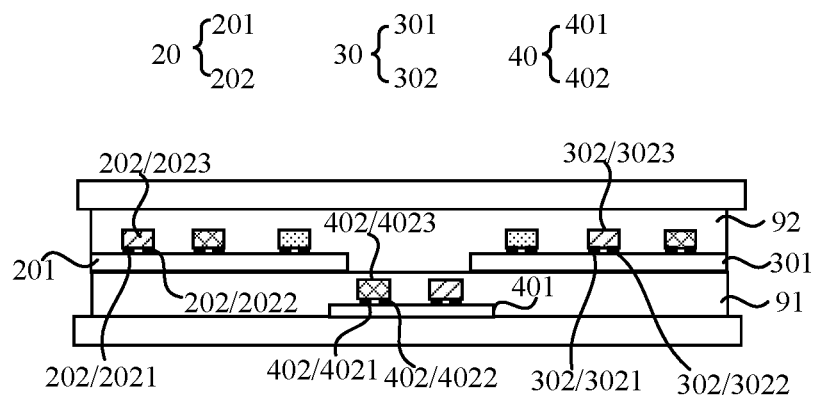
FIG. 15 is a section view taken along section line BB' of FIG. 13 to illustrate the structure of the display panel of FIG. 13.

On the basis of the preceding embodiment, FIG. 14 is a section view taken along section line AA' of FIG. 1 to illustrate the structure of the display panel of FIG. 1. FIG. 15 is a section view taken along section line BB' of FIG. 13 to illustrate the structure of the display panel of FIG. 13'. As shown in FIGS. 14 and 15, the first display subpanel 20 includes a first driving substrate 201 and a plurality of first light-emitting elements 202. One first light-emitting element 202 includes a first anode 2021, a first cathode 2022 and a first light-emitting layer 2023. The first anode 2021 and/or the first cathode 2022 is located on the side of the first light-emitting layer 2023 facing the first driving substrate 201. The second display subpanel 30 includes a second driving substrate 301 and a plurality of second light-emitting elements 302. One second light-emitting element 302 includes a second anode 3021, a second cathode 3022 and a second light-emitting layer 3023. The second anode 3021 and/or the second cathode 3022 is located on the side of the second light-emitting layer 3023 facing the second driving substrate 301. The third display subpanel 40 includes a third driving substrate 401 and a plurality of third light-emitting elements 402. One third light-emitting element 402 includes a third anode 4021, a third cathode 4022 and a third light-emitting layer 4023. The third anode 4021 and/or the third cathode 4022 is located on the side of the third light-emitting layer 4023 facing the third driving substrate 401.

In an embodiment, one first light-emitting element 202 includes a first anode 2021, a first cathode 2022 and a first light-emitting layer 2023. The first anode 2021 and the first cathode 2022 may be located on the same side of the first light-emitting layer 2023 or on two opposite sides of the first light-emitting layer 2023. This is not limited in this embodiment of the present disclosure. In FIGS. 14 and 15, the first anode 2021 and the first cathode 2022 are located on the same side of the first light-emitting layer 2023 and are located on the side of the first light-emitting layer 2023 facing the first driving substrate 201 to facilitate the electrical connection between the first anode 2021 and the first driving substrate 201 and the electrical connection between the first cathode 2022 and the first driving substrate 201 and to ensure the normal transmission of the display signal (such as the data signal or the power signal). The first driving substrate 201 may be disposed with a plurality of first pixel circuits (not shown). The first pixel circuits are configured to provide the display signals for the first light-emitting elements 202. One first pixel circuit may include at least one thin-film transistor, for example, the 2T1C pixel circuit or a 7T1C pixel circuit. This is not limited in this embodiment of the present disclosure.

Further, one second light-emitting element 302 includes a second anode 3021, a second cathode 3022 and a second light-emitting layer 3023. The second anode 3021 and the second cathode 3022 may be located on the same side of the second light-emitting layer 3023 or on two opposite sides of the second light-emitting layer 3023, and this embodiment of the present disclosure is not for the purpose of limiting. In FIGS. 14 and 15, the second anode 3021 and the second cathode 3022 are located on the same side of the second light-emitting layer 3023 and are located on the side of the second light-emitting layer 3023 facing the second driving substrate 301 to facilitate the electrical connection between the second anode 3021 and the second driving substrate 301 and the electrical connection between the second cathode 3022 and the second driving substrate 201 and to ensure the normal transmission of the display signal (such as the data signal or the power signal). The second driving substrate 301 may be disposed with a plurality of second pixel circuits (not shown). The second pixel circuits are configured to provide the display signals for the second light-emitting elements

302. One second pixel circuit may include at least one thin-film transistor, for example, the 2T1C pixel circuit or the 7T1C pixel circuit. This is not limited in this embodiment of the present disclosure.

Further, one third light-emitting element 402 includes a third anode 4021, a third cathode 4022 and a third light-emitting layer 4023. The third anode 4021 and the third cathode 4022 may be located on the same side of the third light-emitting layer 4023 or on two opposite sides of the third light-emitting layer 4023. This is not limited in this embodiment of the present disclosure. In FIGS. 14 and 15, the third anode 4021 and the third cathode 4022 are located on the same side of the third light-emitting layer 4023 and are located on the side of the third light-emitting layer 4023 facing the third driving substrate 401 to facilitate the electrical connection between the third anode 4021 and the third driving substrate 401 and the electrical connection between the third cathode 4022 and the third driving substrate 401 and to ensure the normal transmission of the display signal (such as the power signal). The third driving substrate 401 may be disposed with a plurality of third pixel circuits or only a power signal line (not shown). Accordingly, the third light-emitting elements 402 can achieve active driving or passive driving. In the case where the third light-emitting elements 402 are actively driven, the third pixel circuits is configured to provide the display signals for the third light-emitting elements 402. One third pixel circuit may include at least one thin-film transistor, for example, the 2T1C pixel circuit or the 7T1C pixel circuit. This is not limited in this embodiment of the present disclosure.

It is to be noted that the third light-emitting elements 402 in the previous embodiment represents similar characteristics as the third light-emitting elements 1013b.

In summary, the first light-emitting elements 202, the second light-emitting elements 302 and the third light-emitting elements 402 are disposed as light-emitting elements with formal structures or light-emitting elements with vertical structures to ensure that the connection relation between the light-emitting elements and the driving substrates is simple and stable, and the connection process is simple.

On the basis of the previous embodiment, continuing to refer to FIGS. 14 and 15, the third display subpanel 40 is located on the light emission side of the first display subpanel 20, or the first display subpanel is located on the light emission side of the third display subpanel 40.

As shown in FIG. 14, the third display subpanel 40 is located on the light emission side of the first display subpanel 20, that is, the third display subpanel 40 covers the joint between the first display subpanel 20 and the second display subpanel 30 from the light emission side of the first display subpanel 20 to ensure that the joint is invisible. In one embodiment, as shown in FIG. 15, the first display subpanel 20 is located on the light emission side of the third display subpanel 40, that is, the third display subpanel 40 covers the joint between the first display subpanel 20 and the second display subpanel 30 from the light non-emission side of the first display subpanel 20 to ensure that the joint is invisible.

Further, the display panel according to this embodiment of the present disclosure may further include a first support film and a second support film for supporting the display panel. In the case where the third display subpanel is located on the light emission side of the first display subpanel, the first support film is located on the side of the first display subpanel facing away from the third display subpanel and supports and protects the display panel from the side of the first display subpanel, and the second support film is located on the side of the third display subpanel facing away from the first display subpanel and supports and protects the display panel from the side of the third display subpanel. In the case where the first display subpanel is located on the light emission side of the third display subpanel, the first support film is located on the side of the third display subpanel facing away from the first display subpanel and supports and protects the display panel from the side of the third display subpanel, and the second support film is located on the side of the first display subpanel facing away from the third display subpanel and supports and protects the display panel from the side of the first display subpanel.

It is to be noted that for a plurality of first light-emitting elements in the first display subpanel, a plurality of second light-emitting elements in the second display subpanel and a plurality of third light-emitting elements in the third display subpanel, the display panel further includes a retaining wall structure (not shown) between two adjacent light-emitting elements. The retaining wall structure can prevent the light between different light-emitting elements from mutual crosstalk. As a result, the good display effect of the display panel is ensured.

On the basis of the previous embodiment, continuing to refer to FIGS. 14 and 15, the first display subpanel 20 and the second display subpanel 30 are disposed in the same layer. In this manner, the overall thickness of the display panel can be reduced, and the display panel with thin-film design can be achieved.

On the basis of the previous embodiment, continuing to refer to FIGS. 14 and 15, the display panel 10 may further include a first encapsulation layer 91 and a second encapsulation layer 92. The first encapsulation layer 91 is located between the first display subpanel 20 and the third display subpanel 40. The third display subpanel 40 is located on the light emission side of the first display subpanel 20. The second encapsulation layer 92 is located on the side of the third display subpanel 40 facing away from the first display subpanel 20, as shown in FIG. 14. In one embodiment, the first display subpanel 20 is located on the light emission side of the third display subpanel 40. The second encapsulation layer 92 is located on the side of the first display subpanel 20 facing away from the third display subpanel 40, as shown in FIG. 15. The thickness of the first encapsulation layer 91 is smaller than the thickness of the second encapsulation layer 92.

In an embodiment, the first display subpanel 20 and the third display subpanel 40 are disposed in different layers. Therefore, the thickness of the first encapsulation layer 91 located between the first display subpanel 20 and the third display subpanel 40 is configured to be smaller, that is, the thickness of the first encapsulation layer 91 is configured to be smaller than the thickness of the second encapsulation layer 92. In this manner, the optical path difference of the light extracted between the first sub-pixel in the first display subpanel 20 and the third sub-pixel in the third display subpanel 40 can be reduced, and the display effect of the first display subpanel 20 and the display effect of the third display subpanel 40 can be ensured to be similar to each other. Therefore, the display difference caused by the arrangement in which two display subpanels are disposed in different layers can be avoided, and the display effect of the display panel can be improved. Further, in the case where the third display subpanel 40 is located on the light emission side of the first display subpanel 20, the second encapsulation layer 92 is located on the side of the third display subpanel 40 facing away from the first display subpanel 20, as shown in FIG. 14. In one embodiment, in the case where the first display subpanel 20 is located on the light emission side of the third display subpanel 40, the second encapsulation layer 92 is located on the side of the first display subpanel 20 facing away from the third display subpanel 40. The second encapsulation layer 92 may serve as an encapsulation protection layer for the entire display panel. The thickness of the second encapsulation layer 92 is configured to be larger, that is, the thickness of the second encapsulation layer 92 is larger than the thickness of the first encapsulation layer 91. In this manner, the encapsulation protection function of the second encapsulation layer 92 can be improved, and the stability of the display panel can be improved.

On the basis of the previous embodiment, continuing to refer to FIGS. 14 and 15, a refractive index n1 of the first encapsulation layer 91 and a refractive index n2 of the second encapsulation layer 92 satisfy |n1−n2|<0.2, that is, the refractive index difference between the first encapsulation layer 91 and the second encapsulation layer 92 is small to ensure that the deflection degree of the light is small when the light is transmitted in the first encapsulation layer 91 and in the second encapsulation layer 92 and to avoid the situation that when the light is transmitted in the first encapsulation layer 91 and in the second encapsulation layer 92, a large deflection occurs and the deflection affects the light emission position. As a result, the good display effect of the display panel is ensured.

Continuing to refer to FIGS. 14 and 15, the third display subpanel 40 includes third light-emitting elements 402 and a third driving substrate 401 located on the side of the third light-emitting elements 402 facing away from the first display subpanel 20 or facing away from the second display subpanel 30.

In an embodiment, whether the third display subpanel 40 is located on the light emission side of the first display subpanel 20, or the first display subpanel 20 is located on the light emission side of the third display subpanel 40, the third driving substrate 401 is located on the side of the third light-emitting elements 402 facing away from the first display subpanel 20 or facing away from the second display subpanel 30. In this manner, the small distance between the third light-emitting element 402 and the first light-emitting element 202 and the second light-emitting element 302 can be ensured, and the display optical path difference between the third display region 13 and the first display region 11 and the second display region 12 can be reduced. Therefore, the display effect of the display panel can be improved.

Further, continuing to refer to FIGS. 14 and 15, in the case where the third display subpanel 40 is located on the light emission side of the first display subpanel 20, the third driving substrate 401 is configured to be located on the side of the third light-emitting elements 402 facing away from the first display subpanel 20 or facing away from the second display subpanel 30, that is, the third display subpanel 40 is, with a "flip-chip" process, disposed on the light emission side of the first display subpanel 20 or the second display subpanel 30. In this manner, a simple disposition process of the third display subpanel is ensured.

On the basis of the previous embodiment, continuing to refer to FIG. 14, the third display subpanel 40 further includes a reflective layer 403 located on the side of the third light-emitting elements 402 facing away from the third driving substrate 401. The third light-emitting elements 402 and the reflective layer 403 at least partially overlap in the light emission direction (the X-direction as shown in the figure) of the display panel. For the third display subpanel 40 disposed in a "flip-chip" manner, the reflection layer 403 is disposed on the side of the third light-emitting elements 402 facing away from the third driving substrate 401. In one embodiment, the third light-emitting elements 402 and the reflective layer 403 at least partially overlap in the light emission direction of the display panel. The reflective layer 403 reflects at least part of the light incident on the reflective layer 403 by the third light-emitting elements 402 to improve the light emission efficiency of the third display subpanel. In this manner, the display effect of the display panel can be improved. In an embodiment, to achieve the reflective function, the reflective layer 403 may be disposed with a reflective optical element (such as a reflective mirror) or may, to become the reflective layer, coat reflective material, such as white ink, on the region where the third light-emitting elements 402 and the reflective layer 403 at least partially overlap in the light emission direction of the display panel. This embodiment of the present disclosure does not limit the specific disposition of the reflective layer.

Figure 16:
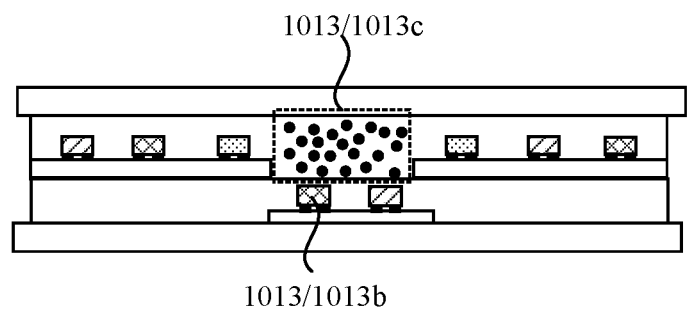
FIG. 16 is another section view taken along section line BB' of FIG. 13 to illustrate the structure of the display panel of FIG. 13.

On the basis of the previous embodiment, FIG. 16 is another section view taken along section line BB' of FIG. 13 to illustrate the structure of the display panel of FIG. 13. As shown in FIG. 16, the third display region 13 includes a plurality of third sub-pixel units 1013 arranged in an array. One third sub-pixel 1013 includes a third light-emitting elements 1013b and a scattering particle layer 1013c located on the light emission side of the third light-emitting elements 1013b.

In an embodiment, the scattering particle layer 1013c is added on the light emission side of the third light-emitting element 1013b, and the scattering particle layer 1013c is configured to include a plurality of scattering particles. The light diverges through the scattering particles to ensure that the joint between the first display region 11 and the second display region 12 is invisible. In an embodiment, in the case where the display panel 10 is in a lighting state, the light emitted by the third light-emitting element 1013b is diverged by the scattering particles to ensure that the joint between the first display region 11 and the second display region 12 is invisible. In an embodiment, in the case where the display panel 10 is in a closed state, the ambient light diverges through the scattering particles to avoid or reduce the incidence of the ambient light onto the joint region between the first display region 11 and the second display region 12 and to ensure that the joint is invisible.

Further, the scattering particles may include laser particles, that is, the particles that may be excited by a short wavelength to extract the light. Therefore, the light emission wavelength of the third light-emitting element may be configured to be smaller than the stimulated emission wavelengths of the excited particles to ensure that the laser particles can be excited and extract the light. For example, the third light-emitting element may be disposed as a blue light-emitting element. The laser particles may be red light quantum dots or green light quantum dots. The blue light-emitting element excites the red light quantum dots or the green light quantum dots to extract the light to ensure the normal light emission and the display of the third display region.

Figure 17:
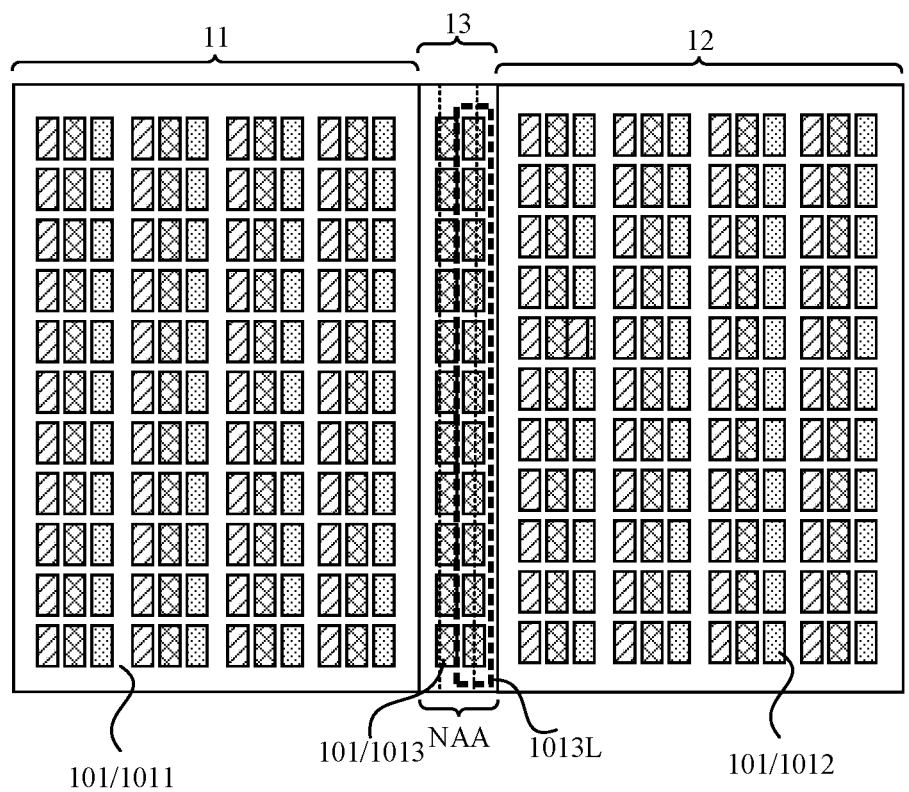
FIG. 17 is a top view illustrating the structure of another display panel according to an embodiment of the present disclosure.

On the basis of the previous embodiment, FIG. 17 is a view illustrating the structure of the arrangement of the sub-pixel of another display panel according to an embodiment of the present disclosure. As shown in FIG. 17, the third sub-pixels 1013 include at least one third sub-pixel column 1013L. The number n of the third sub-pixel columns satisfies n<3. The light-emitting colors of the third sub-pixels 1013 are the same.

In an embodiment, since the third display region 13 is only used to cover the joint between the first display region 11 and the second display region 12, only a small number of the third sub-pixel columns 1013L may be disposed in the third display region 13 to achieve the object of covering the joint. For example, the number n of the third sub-pixel columns is configured to satisfy n<3. In this manner, a simple disposition of the sub-pixels in the third display region 13 is ensured. Further, the light-emitting colors of the third sub-pixels 1013 may be configured to be the same. In this manner, the simple disposition of the sub-pixel in the third display region 13 is further ensured.

Further, in the case where the light-emitting colors of the third sub-pixels 1013 are the same, according to the specific disposition of the first sub-pixels 1011 in the first display region 11 and the specific disposition of the second sub-pixels 1012 in the second display region 12, the third sub-pixels 1013 are configured to cooperate with the first sub-pixels 1011 facing a side of the third display region 13 in the first display region 11 to obtain the complete pixel units, and/or the third sub-pixels 1013 may cooperate with the second sub-pixels 1012 facing a side of the third display region 13 in the second display region 12 to obtain the complete pixel units (not shown). In this manner, it is ensured that the display effect of the boundary position between the first display region 11 and the third display region 13 and/or the display effect of the boundary position between the second display region 12 and the third display region 13 is good. In one embodiment, the third sub-pixels 1013 do not need to cooperate with the first sub-pixels 1011 in the first display region 11 or the second sub-pixels 1012 in the second display region 12 to obtain the complete pixel units, as shown in FIG. 17. In this manner, it can be ensured that the first display region 11, the second display region 12 and the third display region 13 are disposed independently, and the arrangement and the control manner of the first sub-pixels 1011, the second sub-pixels 1012 and the third sub-pixels 1013 are simple. As a result, the operation mode of the display panel is simple. Therefore, the light-emitting response speed of the display panel can be improved.

It is to be noted that the previous embodiment give a description by using an example in which the light-emitting colors of the third sub-pixels 1013 are configured to be the same when the number of the third sub-pixel columns is small. It can be understood that the same light-emitting colors of the third sub-pixels may also not be related to the number of the third sub-pixel columns. In an embodiment, for the display panel with a specific display requirement, for example, a single color, such as red, green or blue, needs to be displayed in a specific region (such as the third display region), at this time, the light-emitting colors of the third sub-pixels 1013 may also be configured to be the same to satisfy the specific display requirement.

On the basis of the previous embodiment, one third sub-pixels may include a third light-emitting element. In the case where the third light-emitting element includes a micro light-emitting diode, the third light-emitting element may be configured to include a blue light-emitting element. In one embodiment, in the case where the third light-emitting element includes an organic light-emitting diode, one third light-emitting element may be configured to include a green light-emitting element.

For the micro light-emitting diode, the blue light-emitting diode has the highest light-emitting efficiency. In the case where the third light-emitting element includes the micro light-emitting diode, the third light-emitting element may be configured to include the blue light-emitting element. In this manner, the light-emitting brightness of the third display region can be ensured to be larger under the same driving power, and the driving power of the third display region can be ensured to be smaller under the same light-emitting brightness requirement. Therefore, the power consumption can be saved, and the service life of the third light-emitting element can be improved. For the organic light-emitting diode, the green organic light-emitting diode has the highest light-emitting efficiency. In the case where the third light-emitting element includes the organic light-emitting diode, the third light-emitting element may be configured to include the green light-emitting element. In this manner, the light-emitting brightness of the third display region can be ensured to be larger under the same driving power, and the driving power of the third display region can be ensured to be smaller under the same light-emitting brightness requirement. Therefore, the power consumption can be saved, and the service life of the third light-emitting element can be improved.

Figure 18:
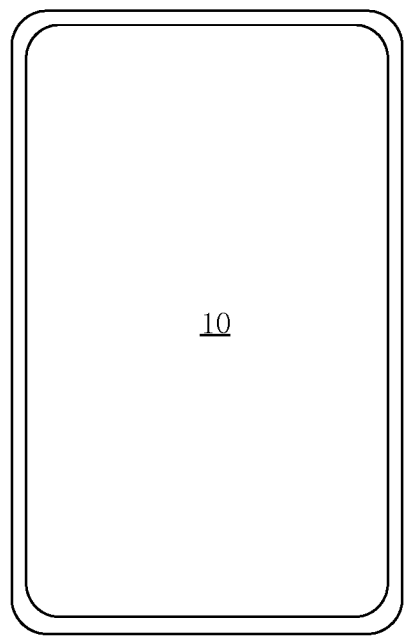
FIG. 18 is a view illustrating the structure of a display panel according to an embodiment of the present disclosure.

On the basis of the same inventive concept, the present disclosure further provides a display device. FIG. 18 is a view illustrating the structure of a display device according to an embodiment of the present disclosure. The display device 100 includes the display panel 10 according to any previous embodiment. Therefore, the display device 100 has the same beneficial effect as the previous display panel. For details about the similarity, see the description of the previous embodiment of the display panel. The details are not repeated here. The display device according to this embodiment of the present disclosure may be the phone shown in FIG. 18 or any electronic product with a display function, including but not limited to a television, a notebook computer, a desktop display, a tablet computer, a digital camera, a smart bracelet, a pair of smart glasses, an in-vehicle display, a medical device, an industrial control device, or a touch interactive terminal. This is not particularly limited in this embodiment of the present disclosure.

What is claimed is:

1. A display panel, comprising:
   a first display region, a second display region and a non-display region between the first display region and the second display region; and
   a third display region, wherein the third display region and the non-display region at least partially overlap in a light emission direction of the display panel,
   wherein the display panel further comprises:
   a plurality of sub-pixels arranged in an array, wherein the plurality of sub-pixels comprise a plurality of first sub-pixels arranged in an array in the first display region, a plurality of second sub-pixels arranged in an array in the second display region and a plurality of third sub-pixels arranged in an array in the third display region;
   the third display region is located between the first display region and the second display region, and
   at least one of: the first display region comprises a plurality of first pixel units arranged in an array and a plurality of first boundary sub-pixels on a side of the first display region facing the third display region, the plurality of first boundary sub-pixels and at least part of the plurality of third sub-pixels on a side of the third display region facing the first display region form boundary pixel units, and a sub-pixel arrangement of first sub-pixels in one first pixel unit of the plurality of first pixel units is the same as a sub-pixel arrangement of sub-pixels in one of the boundary pixel units; or the second display region comprises a plurality of second pixel units arranged in an array and a plurality of second boundary sub-pixels on a side of the second display region facing the third display region, the plurality of second boundary sub-pixels and at least part of the plurality of third sub-pixels on a side of the third display region facing the second display region form boundary pixel units, and a sub-pixel arrangement of second sub-pixels in one second pixel unit of the plurality of second pixel units is the same as a sub-pixel arrangement of sub-pixels in one of the boundary pixel units.

2. The display panel according to claim 1, wherein the first display region comprises a plurality of first pixel units arranged in an array, the second display region comprises a plurality of second pixel units arranged in an array, and the third display region comprises a plurality of third pixel units arranged in an array; and the display panel comprises at least one of: among the plurality of first sub-pixels and the plurality of third sub-pixels, a pixel arrangement of first sub-pixels in one first pixel unit of the plurality of first pixel units is the same as a pixel arrangement of third sub-pixels in one third pixel unit of the plurality of third pixel units, or among the plurality of second sub-pixels and the plurality of third sub-pixels, a pixel arrangement of second sub-pixels in one second pixel unit of the plurality of second pixel units is the same as a pixel arrangement of third sub-pixels in the one third pixel unit.

3. A display device, comprising the display panel according to claim 1.

4. A display panel, comprising:
a first display region, a second display region and a non-display region between the first display region and the second display region; and
a third display region, wherein the third display region and the non-display region at least partially overlap in a light emission direction of the display panel,
wherein the non-display region comprises:
a first light-transparent region, and the third display region further comprises a second light-transparent region; and
the first light-transparent region and the second light-transparent region at least partially overlap in the light emission direction of the display panel.

5. The display panel according to claim 4, wherein the display panel comprise:
at least one of: the first display region further comprises a third light-transparent region; and
an arrangement of the second light-transparent region is the same as an arrangement of the third light-transparent region; or
the second display region further comprises a fourth light-transparent region; and
the arrangement of the second light-transparent region is the same as an arrangement of the fourth light-transparent region.

6. The display panel according to claim 4, wherein the non-display region further comprises:
a light-nontransparent region, the light-nontransparent region comprises a pixel driving circuit, and the pixel driving circuit comprises a first pixel driving circuit and a second pixel driving circuit;
the first display region comprises a plurality of first sub-pixels arranged in an array, and one first sub-pixel of the plurality of first sub-pixels comprises a first pixel circuit and a first light-emitting element; and the second display region comprises a plurality of second sub-pixels arranged in an array, and one second sub-pixel of the plurality of second sub-pixels comprises a second pixel circuit and a second light-emitting element; and
the first pixel driving circuit is configured to provide a driving signal for the first pixel circuit, and the second pixel driving circuit is configured to provide a driving signal for the second pixel circuit.

7. The display panel according to claim 6, wherein the first pixel driving circuit comprises:
a first scan driving circuit and a first light-emitting control driving circuit, wherein the first scan driving circuit comprises first scan shift register circuits disposed in a multi-stage cascade, and the first light-emitting control driving circuit comprises first light-emitting control shift register circuits disposed in a multi-stage cascade;
one of the first scan shift register circuits comprises a first latch device, a first logic device and a first buffer device, and the first latch device, the first logic device and the first buffer device are arranged in a first direction; and the first direction is parallel to a direction in which the first display region points to the second display region;
one of the first light-emitting control shift register circuits comprises a second latch device and a second buffer device, and the second latch device and the second buffer device are arranged in the first direction;
the second pixel driving circuit comprises a second scan driving circuit and a second light-emitting control driving circuit, wherein the second scan driving circuit comprises second scan shift register circuits disposed in the multi-stage cascade, and the second light-emitting control driving circuit comprises second light-emitting control shift register circuits disposed in the multi-stage cascade;
one of the second scan shift register circuits comprises a third latch device, a second logic device and a third buffer device, and the third latch device, the second logic device and the third buffer device are arranged in the first direction; and
one of the second light-emitting control shift register circuits comprises a fourth latch device and a fourth buffer device, and the fourth latch device and the fourth buffer device are arranged in the first direction.

8. The display panel according to claim 4, wherein the third display region comprises:
a plurality of third sub-pixels arranged in an array;
one third sub-pixel of the plurality of third sub-pixels comprises an electrode signal line and a third light-emitting element, and the electrode signal line is configured to provide an anode signal and a cathode signal for the third light-emitting element; and
the non-display region further comprises a light-nontransparent region, wherein the electrode signal line and the light-nontransparent region at least partially overlap in the light emission direction of the display panel.

9. A display device, comprising the display panel according to claim 4.

10. A display panel, comprising:
a first display region, a second display region and a non-display region between the first display region and the second display region; and
a third display region, wherein the third display region and the non-display region at least partially overlap in a light emission direction of the display panel,
wherein the display panel satisfies at least one of:
wherein the display panel comprises:

a first display subpanel, a second display subpanel and a third display subpanel;

the first display subpanel comprises the first display region, the second display subpanel comprises the second display region, and the third display subpanel comprises the third display region; and the third display subpanel covers a joint between the first display subpanel and the second display subpanel, wherein the first display subpanel and the second display subpanel are disposed in a same layer, or, wherein the third display region comprises a plurality of third sub-pixels arranged in an array, and one third sub-pixel of the plurality of third sub-pixels comprises a third light-emitting element and a scattering particle layer located on a light emission side of the third light-emitting element, wherein the plurality of third sub-pixels comprise at least one third sub-pixel column, and a number n of the at least one third sub-pixel column satisfies n<3; and light-emitting colors of the plurality of third sub-pixels are the same, wherein one third sub-pixel of the plurality of third sub-pixels comprises a third light-emitting element; and the third light-emitting element comprises a micro light-emitting diode, and the third light-emitting element comprises a blue light-emitting element or the third light-emitting element comprises an organic light-emitting diode, and the third light-emitting element comprises a green light-emitting element.

11. The display panel according to claim 10, wherein the first display subpanel comprises:

a first driving substrate and a plurality of first light-emitting elements, one first light-emitting element of the plurality of first light-emitting elements comprises a first anode, a first cathode and a first light-emitting layer, and at least one of the first anode or the first cathode is located on a side of the first light-emitting layer facing the first driving substrate;

the second display subpanel comprises a second driving substrate and a plurality of second light-emitting elements, one second light-emitting element of the plurality of second light-emitting elements comprises a second anode, a second cathode and a second light-emitting layer, and at least one of the second anode or the second cathode is located on a side of the second light-emitting layer facing the second driving substrate; and the third display subpanel comprises a third driving substrate and a plurality of third light-emitting elements, one third light-emitting element of the plurality of third light-emitting elements comprises a third anode, a third cathode and a third light-emitting layer, and at least one of the third anode or the third cathode is located on a side of the third light-emitting layer facing the third driving substrate.

12. The display panel according to claim 10, wherein the third display subpanel is located on a light emission side of the first display subpanel, or the first display subpanel is located on a light emission side of the third display subpanel.

13. The display panel according to claim 12, further comprising:

a first encapsulation layer and a second encapsulation layer;

wherein the first encapsulation layer is located between the first display subpanel and the third display subpanel;

the third display subpanel is located on the light emission side of the first display subpanel, and the second encapsulation layer is located on a side of the third display subpanel facing away from the first display subpanel; or the first display subpanel is located on the light emission side of the third display subpanel, and the second encapsulation layer is located on a side of the first display subpanel facing away from the third display subpanel; and a thickness of the first encapsulation layer is smaller than a thickness of the second encapsulation layer.

14. The display panel according to claim 13, wherein a refractive index n1 of the first encapsulation layer and a refractive index n2 of the second encapsulation layer satisfy |n1−n2|<0.2.

15. The display panel according to claim 12, wherein the third display subpanel comprises:

a plurality of third light-emitting elements and a third driving substrate located on a side of the plurality of third light-emitting elements facing away from the first display subpanel or facing away from the second display subpanel.

16. The display panel according to claim 15, wherein the third display subpanel further comprises a reflective layer located on a side of the plurality of third light-emitting elements facing away from the third driving substrate; and the plurality of third light-emitting elements and the reflective layer at least partially overlap in the light emission direction of the display panel.

17. A display device, comprising the display panel according to claim 10.

* * * * *